(12) United States Patent
Waidhas et al.

(10) Patent No.: US 10,141,265 B2
(45) Date of Patent: Nov. 27, 2018

(54) BENT-BRIDGE SEMICONDUCTIVE APPARATUS

(71) Applicant: Intel IP Corporation, Santa Clara, CA (US)

(72) Inventors: Bernd Waidhas, Pettendorf (DE); Stephan Stoeckl, Schwandorf (DE); Andreas Wolter, Regensburg (DE); Reinhard Mahnkopf, Oberhaching (DE); Georg Seidemann, Landshut (DE); Thomas Wagner, Regelsbach (DE); Laurent Millou, Munich (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/394,388

(22) Filed: Dec. 29, 2016

(65) Prior Publication Data

US 2018/0190589 A1    Jul. 5, 2018

(51) Int. Cl.

| H01L 23/06 | (2006.01) |
|---|---|
| H01L 23/538 | (2006.01) |
| H01L 25/065 | (2006.01) |
| H01L 23/00 | (2006.01) |
| H01L 21/48 | (2006.01) |
| H01L 23/053 | (2006.01) |

(52) U.S. Cl.
CPC ...... *H01L 23/5386* (2013.01); *H01L 21/4846* (2013.01); *H01L 23/053* (2013.01); *H01L 23/5387* (2013.01); *H01L 24/14* (2013.01); *H01L 24/48* (2013.01); *H01L 25/0655* (2013.01); *H01L 2224/13024* (2013.01); *H01L 2224/16227* (2013.01); *H01L 2224/48137* (2013.01); *H01L 2924/01014* (2013.01); *H01L 2924/1431* (2013.01); *H01L 2924/1434* (2013.01); *H01L 2924/15311* (2013.01); *H01L 2924/15738* (2013.01); *H01L 2924/3025* (2013.01)

(58) Field of Classification Search
CPC .............. H01L 23/5386; H01L 23/053; H01L 23/5387; H01L 24/14; B28D 5/0011
USPC ......................................... 257/684; 438/457
See application file for complete search history.

(56) References Cited

U.S. PATENT DOCUMENTS

| 5,345,205 A | 9/1994 | Kornrumpf |
| 2009/0090541 A1 | 4/2009 | Chia |
| 2009/0162994 A1* | 6/2009 | Sakamoto ............ B23K 26/16 438/463 |

(Continued)

FOREIGN PATENT DOCUMENTS

| KR | 1020140010777 A | 1/2014 |
| WO | 2018125505 A1 | 7/2018 |

OTHER PUBLICATIONS

"International Application Serial No. PCT/US2017/063978, International Search Report dated Mar. 26 2018", 3 pgs.

(Continued)

*Primary Examiner* — David S Blum
(74) *Attorney, Agent, or Firm* — Schwegman Lundberg & Woessner, P.A.

(57) ABSTRACT

A bent-bridge semiconductive apparatus includes a silicon bridge that is integral to a semiconductive device and the silicon bridge is deflected out of planarity. The silicon bridge may couple two semiconductive devices, all of which are from an integral processed die.

22 Claims, 12 Drawing Sheets

(56) References Cited

U.S. PATENT DOCUMENTS

| | | |
|---|---|---|
| 2013/0119558 A1 | 5/2013 | Hwang et al. |
| 2015/0214082 A1* | 7/2015 | Huang .............. H01L 21/67092 |
| | | 438/14 |
| 2015/0373831 A1* | 12/2015 | Rogers .................... H01L 23/18 |
| | | 429/121 |
| 2016/0049344 A1 | 2/2016 | Andry et al. |
| 2016/0197020 A1 | 7/2016 | Lim et al. |
| 2017/0241611 A1* | 8/2017 | Pan ....................... F21S 48/212 |

OTHER PUBLICATIONS

"International Application Serial No. PCT/US2017/063978, Written Opinion dated Mar. 26, 2018", 11 pgs.

* cited by examiner

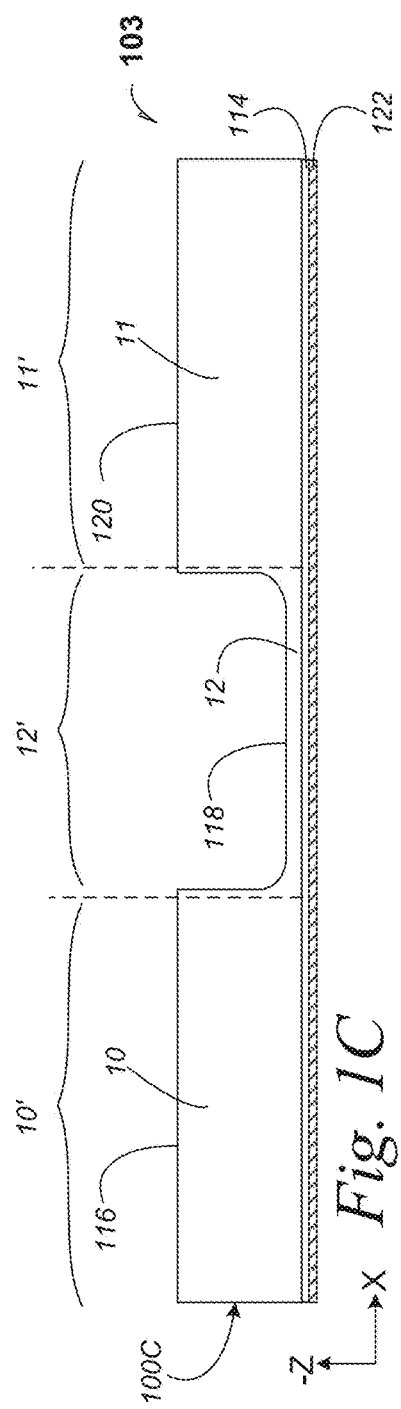
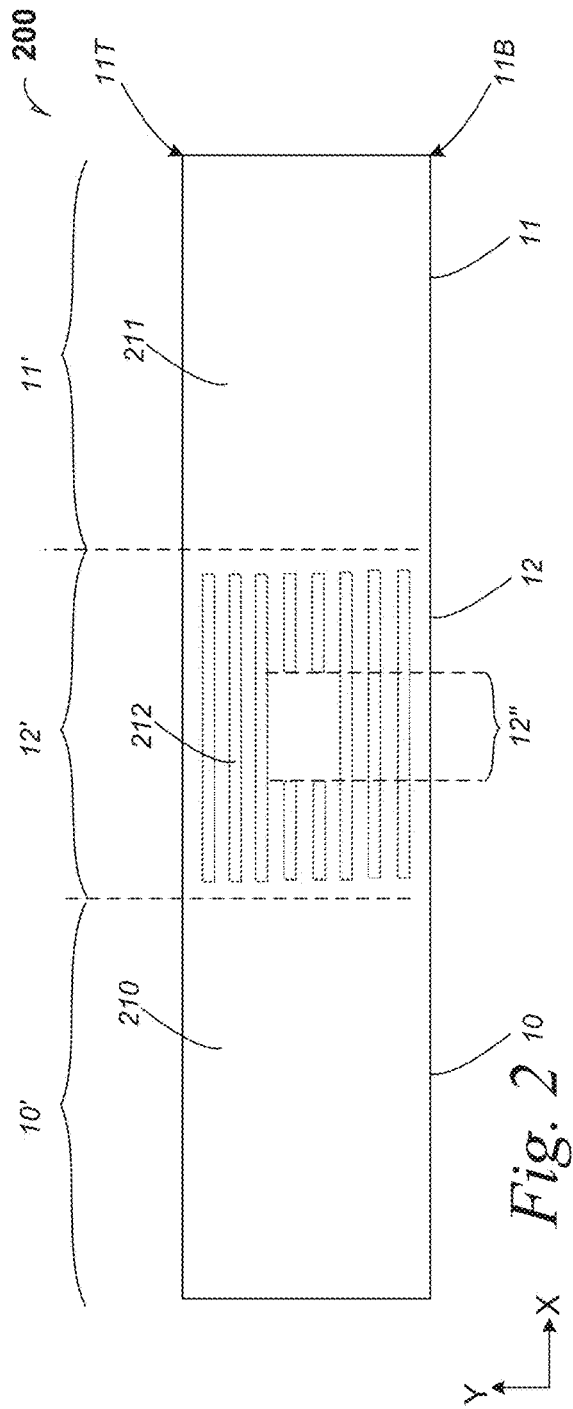

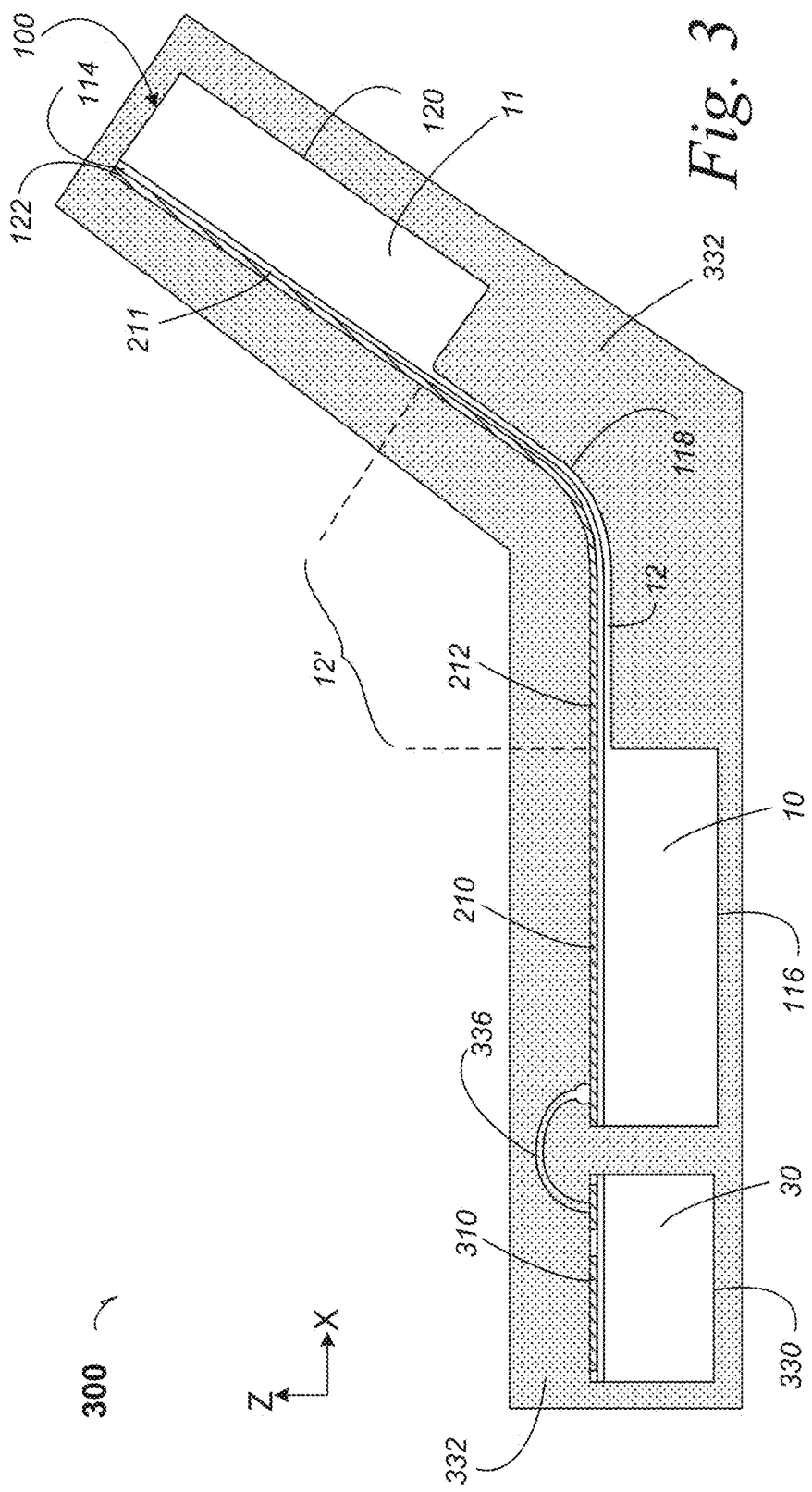

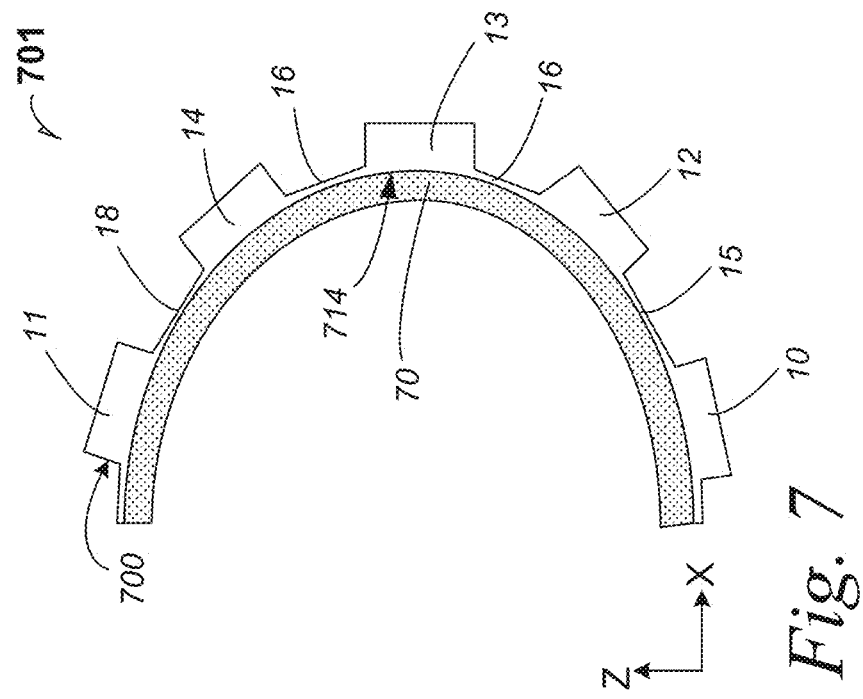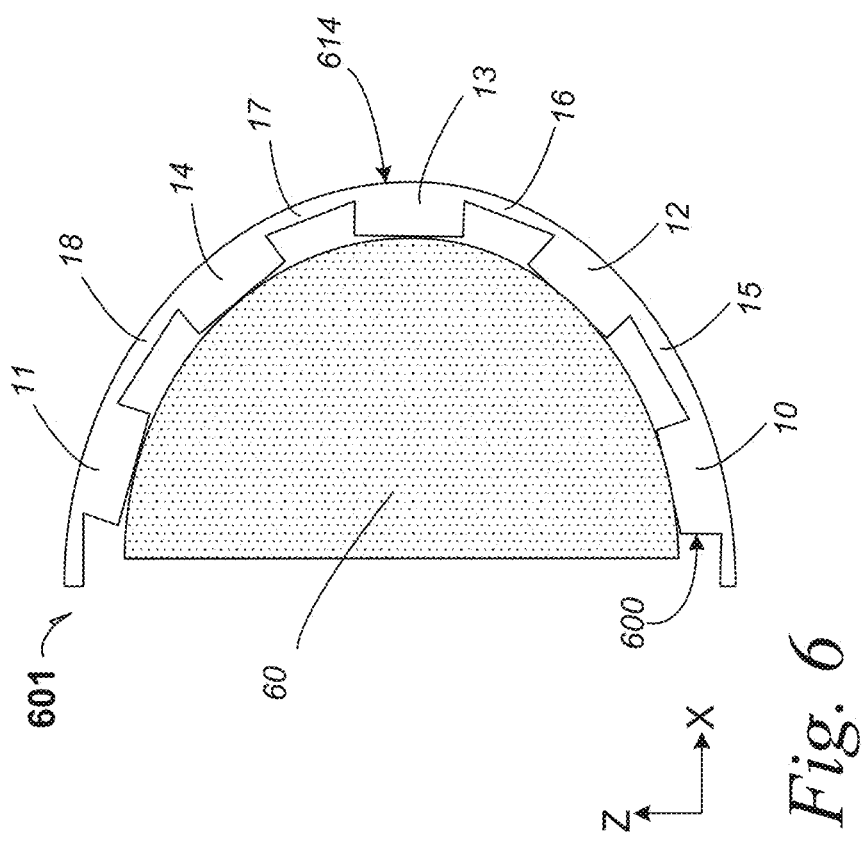

BENT-BRIDGE SEMICONDUCTIVE APPARATUS

FIELD

This disclosure relates to bent-bridge semiconductive apparatus that includes bent silicon after front-end fabrication is completed.

BACKGROUND

Package miniaturization poses device-integration challenges, where small footprint and thin-profile form factors are useful, but high-speed interconnections between devices are challenging.

BRIEF DESCRIPTION OF THE DRAWINGS

Disclosed embodiments are illustrated by way of example, and not by way of limitation, in the figures of the accompanying drawings where like reference numerals may refer to similar elements, in which:

FIG. 1C is a cross-section elevation of the bent-bridge semiconductive apparatus depicted in FIG. 1B after further processing according to an embodiment;

FIG. 2 is a top plan of the structure depicted in FIG. 1C according to an embodiment;

FIG. 3 is a cross-section elevation of a bent-bridge semiconductive apparatus according to an embodiment;

FIG. 6 is a cross-section elevation of a bent-bridge semiconductive apparatus during processing according to an embodiment;

FIG. 7 is a cross-section elevation of a bent-bridge semiconductive apparatus during processing according to an embodiment;

DETAILED DESCRIPTION

Disclosed embodiments include bent-bridge apparatus where at least one semiconductive device is integral with a semiconductive bridge and the semiconductive bridge is bent out of a typically planar arrangement. Disclosed embodiments include bent-bridge apparatus with two semiconductive devices integrally part of a processed die that also includes an integral semiconductive bridge between the two devices. Disclosed embodiments include a plurality (N) of bent-bridge apparatus where more than two semiconductive devices are integral with an N−1 plurality of integral semiconductive bent bridges.

Figure 1A:
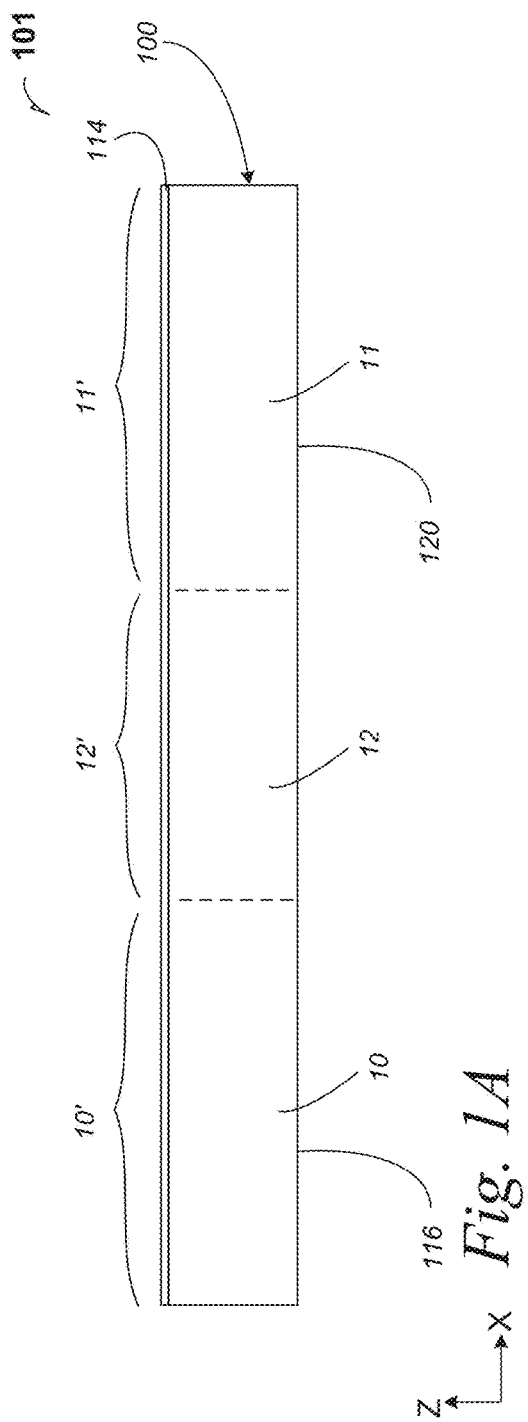
FIG. 1A is a cross-section elevation of a bent-bridge semiconductive apparatus during fabrication according to an embodiment.

FIG. 1A is a cross-section elevation of a bent-bridge semiconductive apparatus 101 during fabrication according to an embodiment. A processed die 100 is an integral piece of semiconductive material. In an embodiment, the processed die 100 is doped silicon. In an embodiment, the processed die 100 is a III-V semiconductive material. In an embodiment, the processed die 100 is differently doped at the region that will become the semiconductive bridge.

The processed die 100 may be referred to as a front-end (FE) die 100 where active devices and other devices are formed in the semiconductive material. Although several semiconductive materials may be employed as useful for a given application, the material will often be referred to herein as "silicon" etc. Semiconductive materials may include silicon and doped silicon in an embodiment. Semiconductive materials may include a III-V composition and a doped III-V composition in an embodiment. In particular where a given integral device may be referred to as "semiconductive device", an integral bridge structure will be referred to as a "silicon bridge" but the integral semiconductive devices will be referred to as "semiconductive device."

The processed die 100 includes a first device 10 that occupies a first X-Y footprint 10' and a backside surface 116 that also occupies the first X-Y footprint 10'. A subsequent device 11 occupies a subsequent X-Y footprint 11' and a backside surface 120 that also occupies the subsequent X-Y footprint 11'. And a silicon bridge region 12 occupies a silicon bridge X-Y footprint 12'. Active devices, including devices that may be fabricated within the silicon bridge region 12 are located at an active surface 114. The active devices have been integrally fabricated on the processed die 100 and they will be further delineated hereinafter.

Figure 1B:
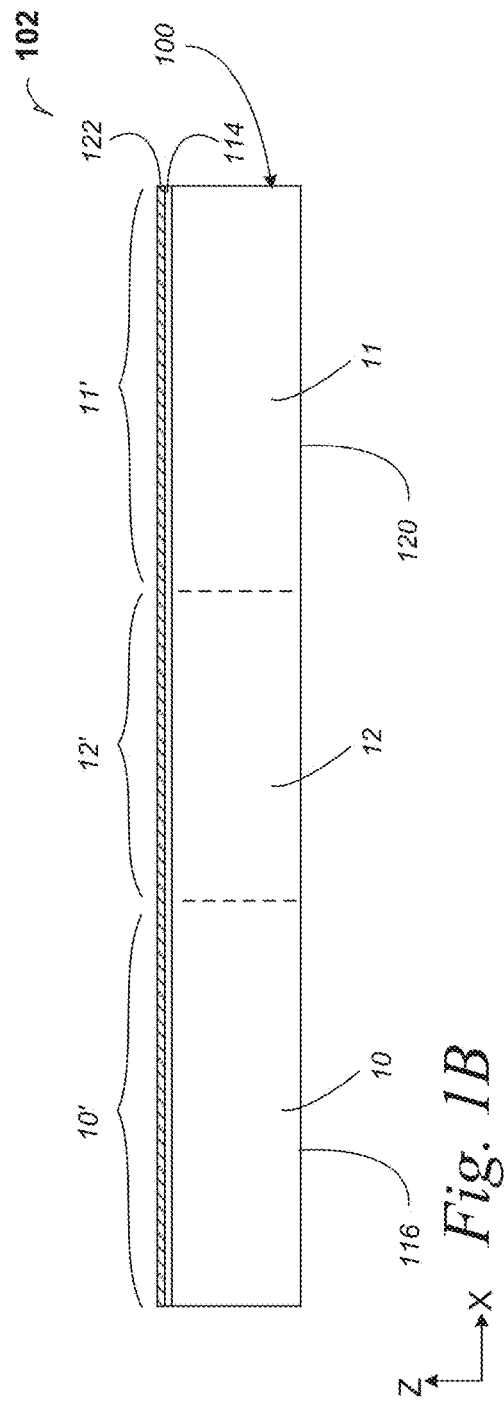
FIG. 1B is a cross-section elevation of the bent-bridge semiconductive apparatus depicted in FIG. 1A after further processing according to an embodiment.

FIG. 1B is a cross-section elevation 102 of the bent-bridge semiconductive apparatus 101 depicted in FIG. 1A after further processing according to an embodiment. In an embodiment, metallization 122 has been formed over the semiconductive devices 10 and 11 and the silicon bridge region 12 that occupy the active surface 114 in a back-end-of-line (BEOL) process. Metallization 122 for the several regions of semiconductive devices and the silicon bridge will be further delineated. In an embodiment, the metallization 122 is structured with copper that touches or couples to semiconductive material, and the metallization 122 is interlayered with interlayer dielectric (ILD) materials to assure completed circuits and electrical insulation.

FIG. 1C is a cross-section elevation 103 of the bent-bridge semiconductive apparatus 102 depicted in FIG. 1B after further processing according to an embodiment. FIG. 1C is illustrated in negative-Z dimensions as the structure 102 in FIG. 1B has been inverted. The processed die 100 depicted in FIG. 1B has been thinned to a thinned-bridge die 100C such that a structural change has occurred.

A silicon thinning process has been carried out within the bridge footprint 12' such that the silicon bridge 12 has been thinned to expose a bridge backside surface 118. By the bridge-thinning process, the bridge backside surface 118 is below the first backside surface 116 as well as below the subsequent backside surface 120. It can now be seen that an integral unit of semiconductive material includes a first semiconductive device 10, a subsequent semiconductive device 11 and a silicon bridge 12. Further, the first semiconductive device 10 includes the BEOL metallization 122 and the first backside surface 116. The silicon bridge 12 includes the BEOL metallization 122 and the bridge backside surface 118. And the subsequent semiconductive device 11 includes the BEOL metallization 122 and the subsequent semiconductive device backside surface 120.

In an embodiment, thinning of the silicon bridge 12 is carried out by an etching process. In an embodiment, thinning of the silicon bridge 12 is carried out by a reactive ion etch (RIE) process. In an embodiment, thinning of the silicon bridge 12 is carried out by a wet etching process. In an embodiment, thinning of the silicon bridge 12 is carried out by a wet etching process, followed by an RIE process.

In an embodiment where dimensions allow, a die-backside partial dicing is carried out with a dicing saw that opens the recess that creates the thinned silicon bridge 12 with the bridge backside surface 118.

In any event whether by etching, die-backside partial dicing, or combinations thereof, thinning to achieve the bridge backside surface 118 is accomplished such that bending of the silicon bridge 12 may be accomplished while maintaining useful silicon bridge qualities.

In an embodiment, a doping process is carried out with the processed die 100C in the depicted orientation such that doping into the silicon bridge 12 may penetrate through the bridge backside surface 118 into the active regions of the silicon bridge 12, but penetration through the die backside surfaces 116 and 120 does not reach the active regions of the first and subsequent dies, 10 and 11 respectively.

Figure 11:
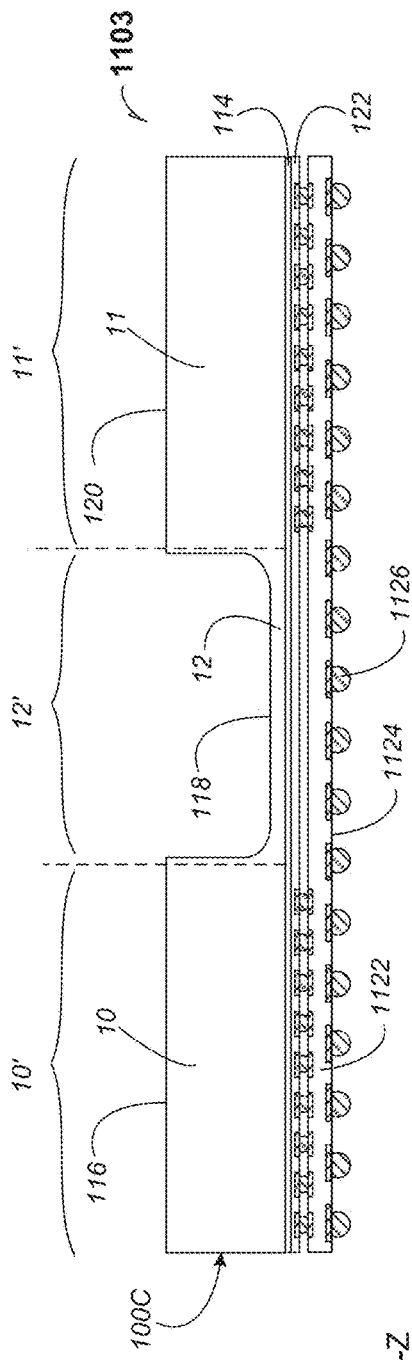
FIG. 11 is a cross-section elevation of the bent-bridge semiconductive apparatus depicted in FIG. 1B after further processing according to an embodiment.

FIG. 11 is a cross-section elevation 1103 of the bent-bridge semiconductive apparatus 102 depicted in FIG. 1B after further processing according to an embodiment. A redistribution layer (RDL) 1122 is formed on the active surface 114 and metallization 122 that includes a series of electrical bumps that couple to the RDL 1122. On a land side 1124 of the RDL 1122, a series of electrical bumps, one of which is indicated with reference numeral 1126, provides further electronic communication for after the silicon bridge 12 is deflected out of planarity. Thus, it may be understood.

Figure 12:
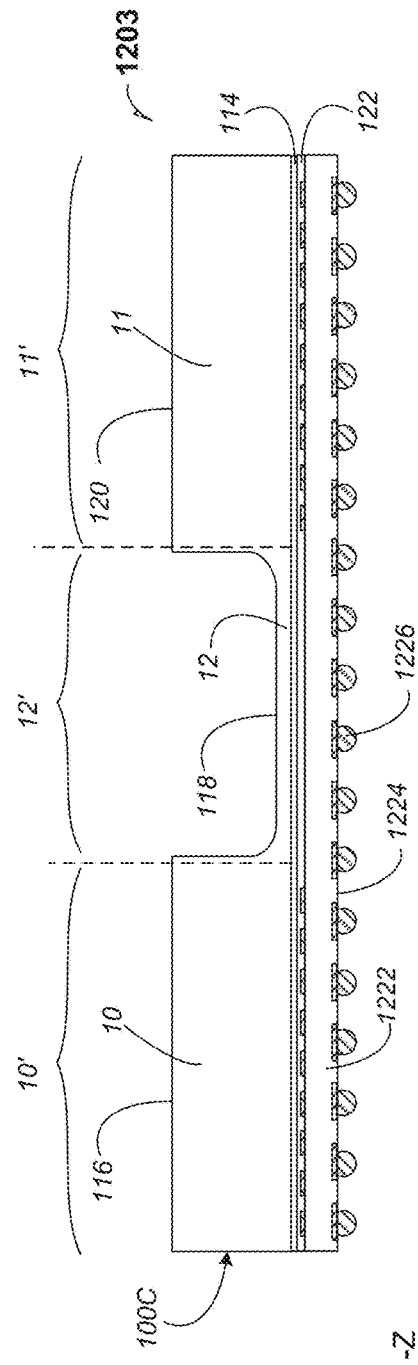
FIG. 12 is a cross-section elevation of the bent-bridge semiconductive apparatus depicted in FIG. 1B after further processing according to an embodiment.

FIG. 12 is a cross-section elevation 1203 of the bent-bridge semiconductive apparatus 102 depicted in FIG. 1B after further processing according to an embodiment. In an embodiment, a redistribution layer (RDL) 1222 is formed directly on the active surface 114 and metallization 122 such as by bumpless build-up layer (BBUL) technology. Consequently although bond pads are depicted in the active surface 114 and metallization 122, the BBUL RDL 1222 directly contacts the bond pads. On a land side 1224 of the RDL 1222, a series of electrical bumps, one of which is indicated with reference numeral 1226, provides further electronic communication for after the silicon bridge 12 is deflected out of planarity.

FIG. 2 is a top plan 200 of the structure depicted in FIG. 1C according to an embodiment. The integral metallization 122 as seen in FIG. 1C is now delineated as items 210, 211, and 212. The first semiconductive device 10 has a first metallization 210, the subsequent semiconductive device 11 has a subsequent metallization 211, and the silicon bridge 12 has a silicon bridge metallization 212. The dashed lines seen in FIGS. 1A through 1C are now extended in the Y-direction to schematically separate the respective X-Y footprints of the first, bridge, and subsequent regions 10', 12', and 11'. Only bridge metallization 212 is depicted in detail, and it is depicted in simplified form. The bridge metallization 212 is illustrated in simplified form as a few traces, as a principal function of the silicon bridge 12 is communication between the first semiconductive device 10 and the subsequent semiconductive device 11.

In an embodiment, a logic region 12" is located on the silicon bridge 12 within the bridge metallization 212. For example in an embodiment, the first semiconductive device 10 is a processor such as using Intel Architecture (IA) and fabricated by Intel Corporation of Santa Clara, Calif. For example in an embodiment, the first semiconductive device 10 is a processor such as using Advanced RISK Machines (ARM) technology. In an embodiment, the first semiconductive device 10 as a processor uses the silicon bridge 12 to communicate to the subsequent semiconductive device 11 where the subsequent semiconductive device 11 is memory device. Consequently, the logic region 12" is a memory-controller hub (MCH) 12" that relieves controller function from necessarily being within the subsequent semiconductive device 11. Although the logic region 12" is approximately centrally located in the silicon bridge 12 in FIG. 2, both in X- and Y-directions, it may be located within the bridge other than centrally. In an embodiment where the subsequent semiconductive device 11 is a memory device 11 and the first semiconductive device 10 is a processor 10, the logic region 12" is located closer to the memory device 11 than to the processor 10. In an embodiment, the logic region 12" is located closer to the edge appearing at the bottom of the drawing than to the top. In an embodiment, the logic region 12" is located closer to the edge appearing at the top of the drawing than to the bottom. In an embodiment, the logic region 12" is located closer to the first semiconductive device 10 than to the subsequent device 11.

Figure 1D:
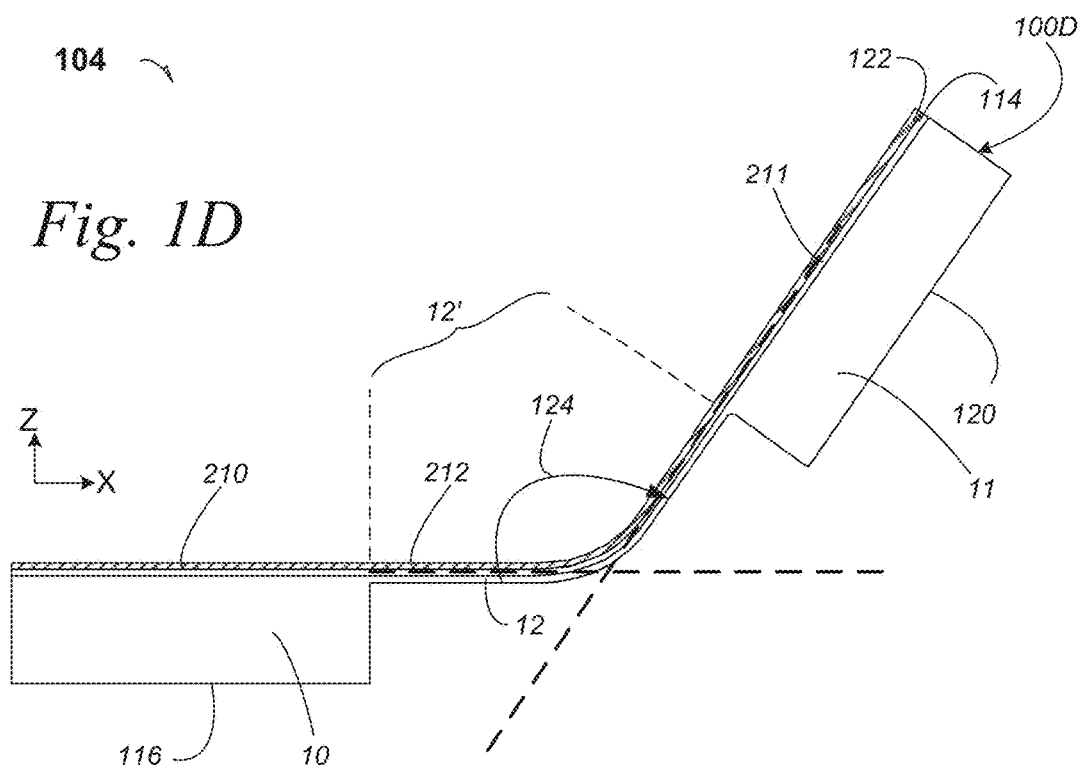
FIG. 1D is a cross-section elevation of the bent-bridge semiconductive apparatus depicted in FIG. 1C after further processing according to an embodiment.

FIG. 1D is a cross-section elevation 104 of the bent-bridge semiconductive apparatus 103 depicted in FIG. 1C after further processing according to an embodiment. FIG. 1D is illustrated in positive-Z dimensions as the structure 103 in FIG. 1C has been inverted again. During processing, the silicon bridge 12 is bent to a given angle 124. By "bent" it is intended for the illustrated embodiment, that the silicon bridge 12 is deflected out of planarity with respect to the planarity of the metallizations 210 and 211 depicted in the processed die before silicon bridge thinning.

In an embodiment, where the silicon bridge 12 is deflected out of planarity, all of the processed die has been thinned to a degree illustrated qualitatively as the thickness of the silicon bridge 12 between the metallization 122 and the bridge backside 118. In this embodiment of the bridge being deflected out of planarity is equivalent to wrapping a ribbon form factor, where the silicon bridge 12 portion of the processed silicon is deflected, regardless of whether the first semiconductive device 10 is also deflected. In an embodiment, where a ribbon form factor is created by thinning, a torsional deflection out of planarity may be accomplished such that at least one silicon bridge in the apparatus forms at least a portion of a helix.

As illustrated in FIG. 1D, the angle 124 appears to be about 45° and it may be quantified by projecting with longer dashed lines from a substantially planar region of the first metallization 210 and likewise from the substantially planar region of the subsequent metallization 211.

Quantification of the angle 124 is useful in embodiments where the adjacent devices 10 and 11 do not significantly bend compared to the bent silicon bridge 12. In an embodiment, the angle 124 is about 1°. In an embodiment, the angle 124 is between about 1 and 10°. In an embodiment, the angle 124 is between about 10° and 30°. In an embodiment, the angle 124 is between about 30° and 90°. In an embodiment, the angle 124 is between about 90° and 180°. Where the angle 124 approaches 180°, measurement of the angle 124 may be estimated as the apex moves far away. In any event, when the angle approaches 180° the two metallizations 210 become parallel planar but not coplanar.

Reference is made to FIG. 2 and FIG. 1D. In an embodiment, the silicon bridge 12 may be deflected out of planarity by torsional bending. For example, where the subsequent semiconductive die 11 depicted in FIG. 1D is illustrated bending uniformly in the Z-direction, the silicon bridge 12 may also be bent such that the top corner 11T depicted in FIG. 2 may be held substantially within the plane of the first metallization 210, while the bottom corner 11B may be bent into the positive-Z direction (out of the plane of the drawing) such that the silicon bridge 12 forms at least a portion of a helix. In an embodiment, the deflection of the silicon bridge may include translational displacing of both corners 11T and 11B.

Figure 1E:
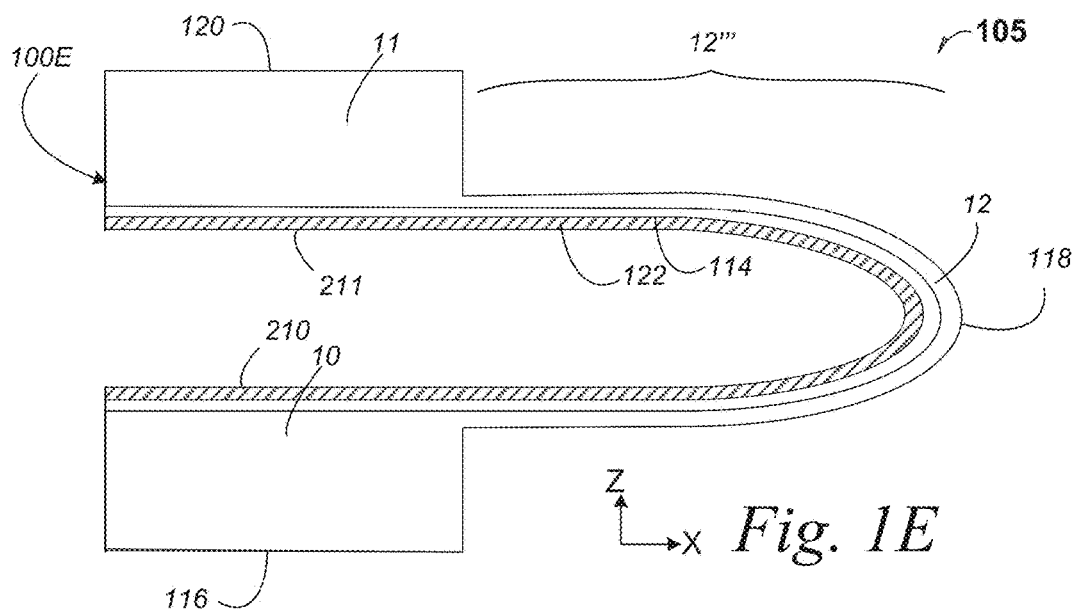
FIG. 1E is a cross-section elevation of the bent-bridge semiconductive apparatus depicted in FIG. 1D after further processing according to an embodiment.

FIG. 1E is a cross-section elevation 105 of the bent-bridge semiconductive apparatus 104 depicted in FIG. 1D after further processing according to an embodiment. The processed die is enumerated as item 100E as a structural change has occurred with the integral semiconductive material. During processing, the silicon bridge 12 is bent to a 180° angle, or it is folded in half as in this illustrated embodiment, where an essentially bilaterally symmetrical structure is being folded. By completing an approximate 180° fold, the X-Y footprint is halved, although the Z-direction footprint is increased.

In an embodiment, a thinned silicon bridge includes the thinned backside surface 118, but the bridge has discrete ends that are mated to a first die and a subsequent die, such that the bend bridge is a discrete silicon bridge and not integral with the first and subsequent dice. For example where a bent silicon bridge 12 depicted in FIG. 4 may be applied to a form-factor device housing 432.

Figure 1F:
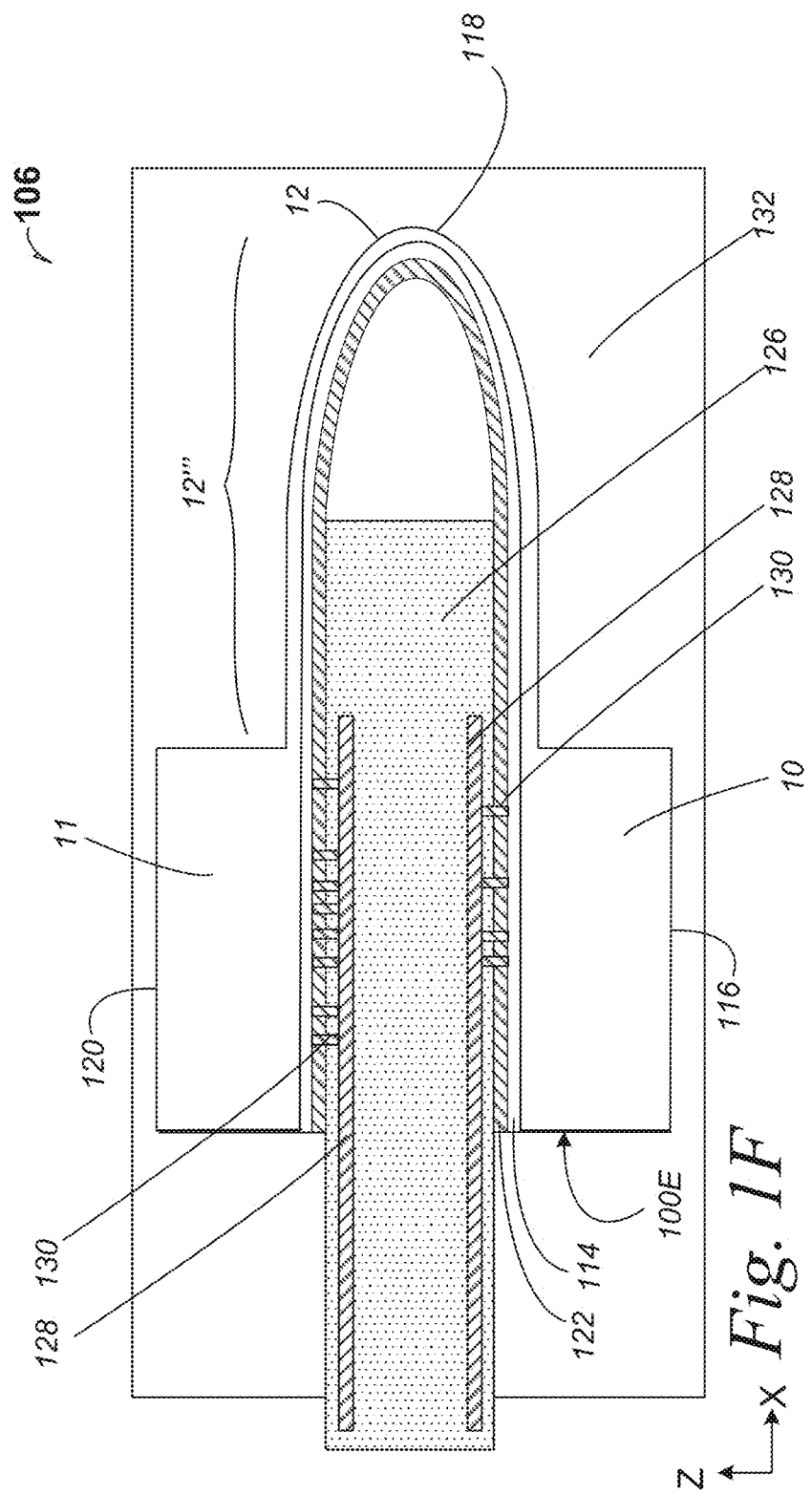
FIG. 1F is a cross-section elevation of the bent-bridge semiconductive apparatus depicted in FIG. 1D after further processing according to an embodiment.

FIG. 1F is a cross-section elevation 106 of the bent-bridge semiconductive apparatus 105 depicted in FIG. 1D after further processing according to an embodiment. During processing, the silicon bridge 12 is bent to the approximate 180° angle while it is bonded onto a substrate 126. In an embodiment, the substrate 126 is made from useful materials such as FR4 construction used in a printed wiring board. During bonding, the metallization 122 is bonded to substrate traces 128 (two occurrences illustrated) such as through interconnects 130 (several occurrences illustrated) such as copper pillars 130. In an embodiment, an apparatus housing 132 is formed such as by overmold processing.

FIG. 3 is a cross-section elevation of a bent-bridge semiconductive apparatus 300 according to an embodiment. A processed die 100 includes a first semiconductive device 10, a silicon bridge 12, and a subsequent semiconductive device 11. The bent-bridge semiconductive apparatus 300 also includes a connected die 30 that is coupled to the processed die 100 by a wire bond 336 according to an embodiment. A connected-die metallization 310 is formed on the connected die 30 and the wire bond 336 couples to the first metallization 210 on the first device 10 according to an embodiment. It may now be understood that the connected die 30 could wire bond to metallizations 212 and 211 depending upon the specific application. In other words, the form factor of the illustrated device housing 332 could be maintained, while wire bonds could reach all three metallizations 210, 211, and 212, or a subset thereof.

The device housing 332 takes a shape that facilitates the bend angle. As illustrated, the device housing 332 forms an angle. In an embodiment, an application is needed to fit a bent-bridge semiconductive apparatus, and the illustrated device housing 332 is useful to fit the bent-bridge semiconductive apparatus 300 into a space that accommodates the form factor of the device housing 332.

Figure 4:
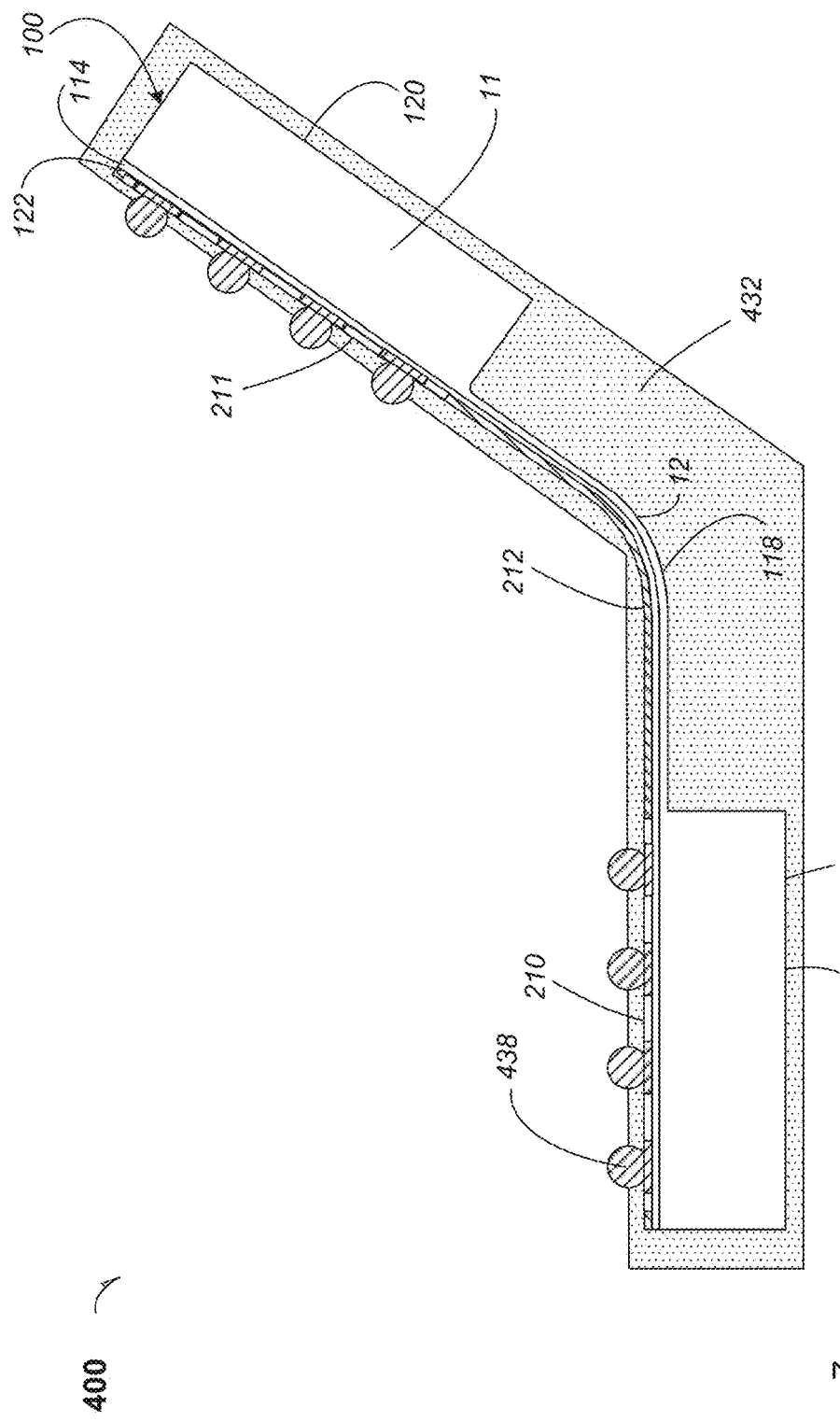
FIG. 4 is a cross-section elevation of a bent-bridge semiconductive apparatus according to an embodiment.

FIG. 4 is a cross-section elevation of a bent-bridge semiconductive apparatus 400 according to an embodiment. A processed die 100 includes a first semiconductive device 10, a silicon bridge 12, and a subsequent semiconductive device 11. The bent-bridge semiconductive apparatus 400 has been bumped with a series of electrical bumps, one of which is indicated with reference number 438. The electrical bumps 438 are bonded both to the first semiconductive device 10 and to the subsequent semiconductive device 11.

An apparatus housing 432 takes a shape that facilitates the bend angle. As illustrated, the device housing 432 forms an angle. In an embodiment, an application is needed to fit a bent-bridge semiconductive apparatus, and the illustrated device housing 432 is useful to fit the bent-bridge semiconductive apparatus 400 into a space that accommodates the form factor of the device housing 432.

Figure 5:
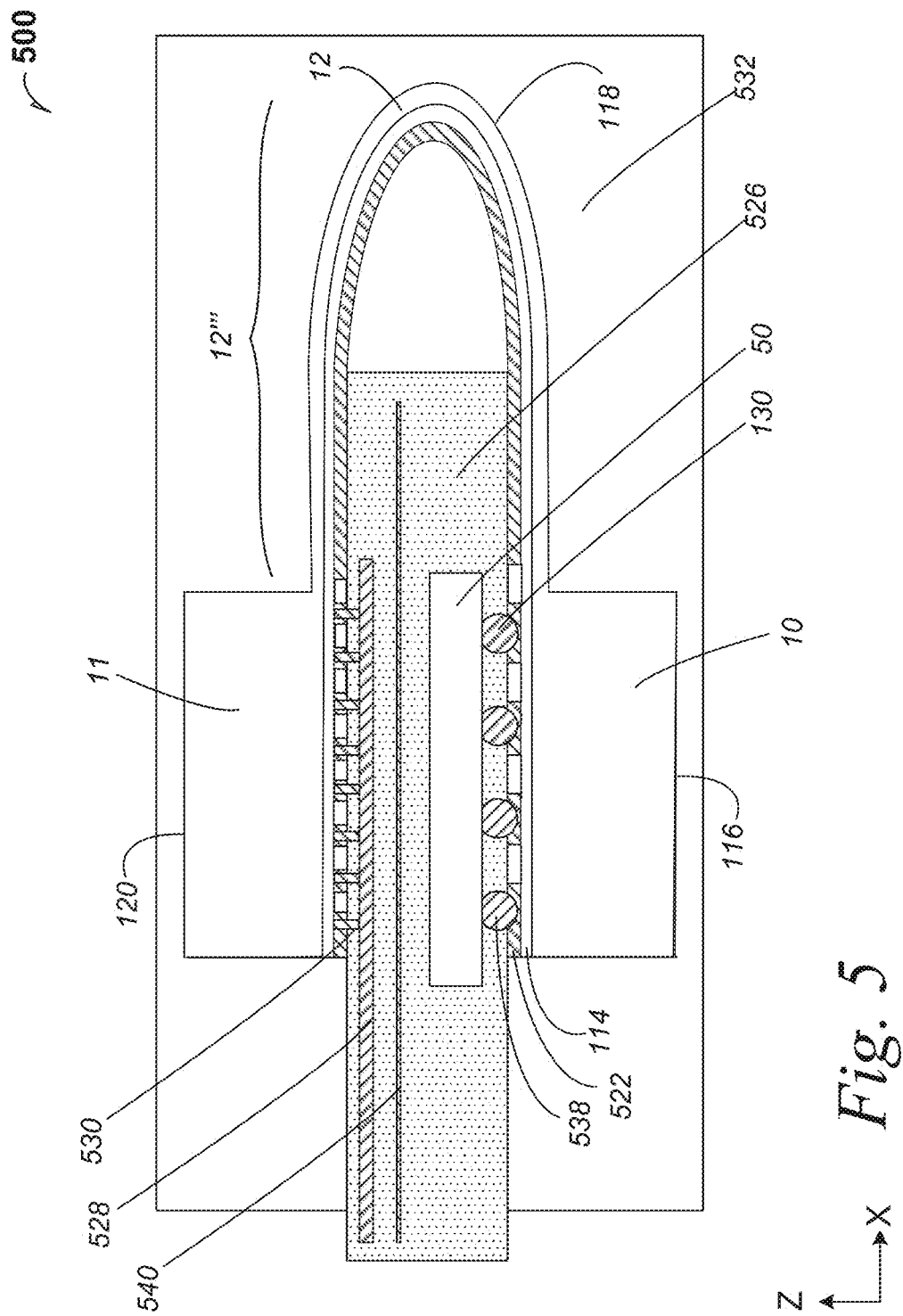
FIG. 5 is a cross-section elevation of the bent-bridge semiconductive apparatus according to an embodiment.

FIG. 5 is a cross-section elevation of the bent-bridge semiconductive apparatus 500 according to an embodiment. A first semiconductive device 10 and a subsequent semiconductive device 11 are set apart with an integral silicon bridge 12 that is bent to an approximate 180° or, in half. During processing, the silicon bridge 12 is bent to the 1800 angle while it is bonded onto a substrate 526. During bonding, a metallization 522 is bonded to a substrate traces 528 such as through interconnects 530 (several occurrences illustrated). In the illustrated embodiment, the first semiconductive device 10 is coupled to a flip-chip 50 through a series of bumps, one of which is indicated with reference number 538. In an embodiment, the first semiconductive device 10 is a processor, the flip-chip 50 is a memory die, and the subsequent semiconductive device 11 is a baseband processor that is shielded such as with shielding 540 within the substrate 526.

In an embodiment, an apparatus housing 532 is formed such as by overmold processing.

FIG. 6 is a cross-section elevation of a bent-bridge semiconductive apparatus 601 during processing according to an embodiment. A processed die 600 is an integral piece of silicon that has been deflected to follow the arc of a mandrel 60. The processed die 600 may be referred to as a front-end (FE) die 600 where active devices and other devices are formed in the silicon. The processed die 600 includes a first semiconductive device 10, a second semiconductive device 12, a third semiconductive device 13, a fourth semiconductive device 14, and a subsequent semiconductive device 11. Between the first semiconductive device 10 and second semiconductive device 12 is a first silicon bridge 15. Between the second semiconductive device 12 and the third semiconductive device 13 is a second silicon bridge 16. Between the third semiconductive device 13 and the fourth semiconductive device 14 is a third silicon bridge 17. And between the fourth semiconductive device 14 and the subsequent semiconductive device 11 is a subsequent silicon bridge 18.

The processed die 600 is illustrated in simplified form without active areas and metallizations particularly illustrated. It may be understood that active areas lie along an active surface 614. After further processing, but before bending along the arc of the mandrel 60, metallization is formed on the active surface 614. In an embodiment, the structure 60 is a permanent part of the bent-bridge semiconductive apparatus 601 such as a form-factor shaping structure. In an embodiment, the structure 60 is a permanent part of the bent-bridge semiconductive apparatus 601 such as a form-factor shaping structure that provides a permanent supporting surface for the processed die 600. In an embodiment, the processed die 600 is fit into a form factor such as a writing implement. In an embodiment, the writing implement is a pen with computing functionality.

In an embodiment, the processed die 600 has been bent along an arc that is described by the mandrel 60 and the mandrel 60 has heat-transfer functionality. As far at the form factor, it is seen the active surface 614 is convex to the overall form factor of the processed die 600.

FIG. 7 is a cross-section elevation of a bent-bridge semiconductive apparatus 701 during processing according to an embodiment. A processed die 700 is an integral piece of silicon that has been deflected along the arc of a mandrel 70. The processed die 700 may be referred to as a front-end (FE) die 700 where active devices and other devices are formed in the silicon. The processed die 700 includes a first semiconductive device 10, a second semiconductive device 12, a third semiconductive device 13, a fourth semiconductive device 14, and a subsequent semiconductive device 11. Between the first semiconductive device 10 and a second semiconductive device 12 is a first silicon bridge 15. Between the second semiconductive device 12 and the third semiconductive device 13 is a second silicon bridge 16. Between the third semiconductive device 13 and the fourth semiconductive device 14 is a third silicon bridge 17. And between the fourth semiconductive device 14 and the subsequent semiconductive device 11 is a subsequent silicon bridge 18.

The processed die 700 is illustrated in simplified form without active areas and metallizations particularly illustrated. It may be understood that active areas lie along an active surface 714. After further processing, but before bending along the arc of the mandrel 70, metallization is formed on the active surface 714. In an embodiment, the structure 70 is a permanent part of the bent-bridge semiconductive apparatus 701 such as a form-factor shaping structure with FR4 qualities of a printed wiring board. For example, a wearable device may be constructed with the processed die 700 and the structure 70 being a shape that is complementary to a contour on an animal wearer.

In an embodiment, the processed die 700 has been bent along an arc that is described by the mandrel 70. As far at the form factor, it is seen that the active surface 714 is concave to the overall form factor of the processed die 700.

It may now be understood that the processed die 700 may be contoured in an active-surface-concave configuration and described along the arc of the mandrel 70. Similarly, it may now be understood that the processed die 700 may be contoured in an active-surface-convex configuration and described along the arc of the mandrel 70.

Figure 8:
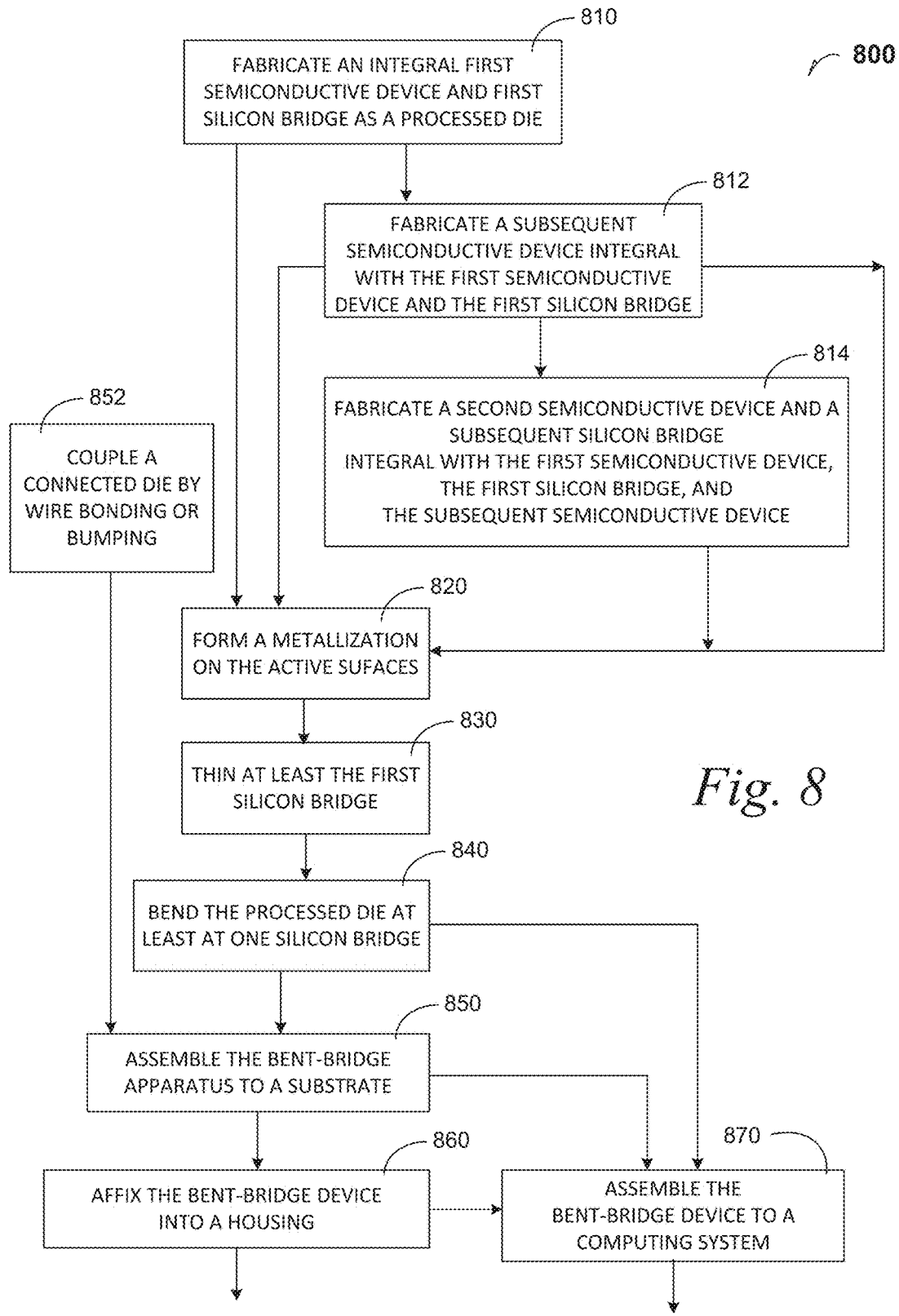
FIG. 8 is a process flow diagram that illustrates assembly of a bent-bridge semiconductive apparatus according to an embodiment.

FIG. 8 is a process flow diagram 800 that illustrates assembly of a bent-bridge semiconductive apparatus according to an embodiment.

At 810, the process includes fabricating an integral first semiconductive device and first silicon bridge as a processed die. At 812, the process includes fabricating a subsequent semiconductive device integral with the first semiconductive device and first silicon bridge. In a non-limiting example embodiment, the first semiconductive device 10, the second semiconductive device 11 and the silicon bridge 12 are fabricated as a processed die 100 as seen in FIG. 1A. At 814, the process includes fabricating a second semiconductive device and a subsequent silicon bridge integral with the first semiconductive device, the first semiconductive bridge, and subsequent semiconductive device.

It is now understandable that more semiconductive devices and silicon bridges may be formed from an integral processed die as illustrated by way of non-limiting examples in FIGS. 6 and 7.

At 820, the process includes forming a metallization on the active surfaces of the semiconductive devices and the silicon bridges, as many as are present. In an embodiment, the process of forming the metallization is added to by forming an RDL according to any embodiment disclosed with respect to one of FIG. 11 or 12.

At 830, the process includes thinning at least one silicon bridge. In a non-limiting example embodiment, all silicon bridge areas are thinned. In a non-limiting example embodiment, the entire processed die is thinned to a degree that it may be bent without breaking.

At 840, the process includes bending the processed die at least at the first silicon bridge. In a non-limiting example embodiment, the processed die 100 depicted initially in FIG. 1A, is bent to form the processed die 100E depicted in FIG. 1E.

At 850, the process includes assembling the bent-bridge device to a substrate.

At 852, the process includes coupling a connected die to the processed die by one of wire bonding or bumping. In a non-limiting example embodiment, a bond wire 336 couples the metallization 210 of the first semiconductive device 10 to a connected die 30 as illustrated in FIG. 3. In a non-limiting and non-equivalent example embodiment, a bump 538 couples a connected die 50 to the first semiconductive device 10 as illustrated in FIG. 5.

At 860, the process includes affixing a bent-bridge device into a housing. In a non-limiting example embodiment, the processed silicon 100 is affixed into an apparatus housing such as a mold-material housing 432 as illustrated in FIG. 4.

At 870, the process includes assembling the bent-bridge device into a computing system. Examples of assembling the bent-bridge device into a computing system is given herein.

Figure 9:
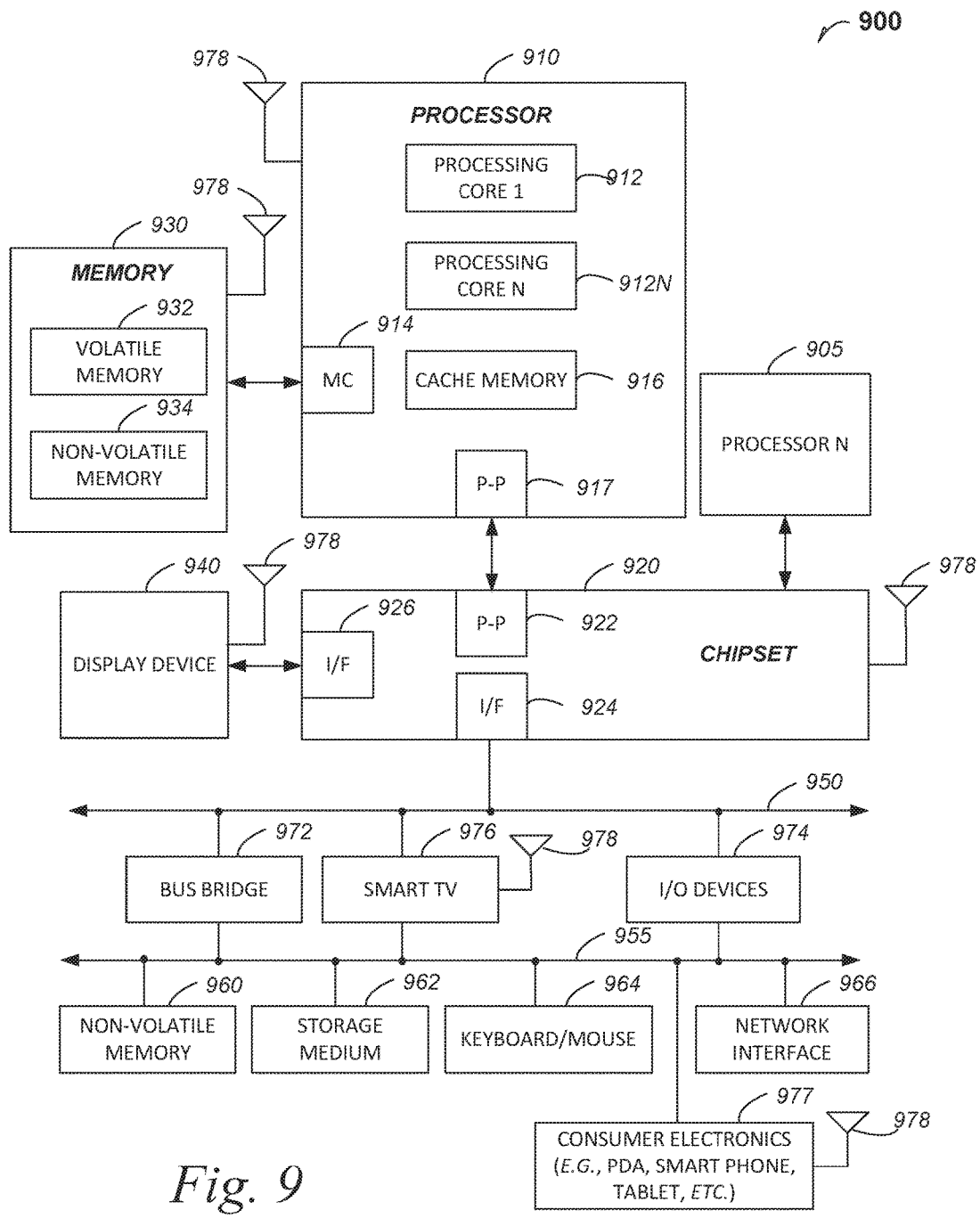
FIG. 9 is included to show an example of a higher level device application for the disclosed embodiments.

FIG. 9 is included to show an example of a higher level device application for the disclosed embodiments. In an embodiment, a computing system 900 includes, but is not limited to, a desktop computer. In an embodiment, a system 900 includes, but is not limited to a laptop computer. In an embodiment, a system 900 includes, but is not limited to a netbook. In an embodiment, a system 900 includes, but is not limited to a tablet. In an embodiment, a system 900 includes, but is not limited to a notebook computer. In an embodiment, a system 900 includes, but is not limited to a personal digital assistant (PDA). In an embodiment, a system 900 includes, but is not limited to a server. In an embodiment, a system 900 includes, but is not limited to a workstation. In an embodiment, a system 900 includes, but is not limited to a cellular telephone. In an embodiment, a system 900 includes, but is not limited to a mobile computing device. In an embodiment, a system 900 includes, but is not limited to a smart phone. In an embodiment, a system 900 includes, but is not limited to an internet appliance. Other types of computing device may be configured with the microelectronic device that includes a bent-bridge semiconductive device embodiment.

In some embodiments, the bent-bridge embodiment 900 includes a system on a chip (SOC) system.

In an embodiment, the processor 910 has one or more processing cores 912 and 912N, where 912N represents the Nth processor core inside processor 910 where N is a positive integer.

In an embodiment, the electronic device system 900 using a bent-bridge embodiment that includes multiple processors including 910 and 905, where the processor 905 has logic similar or identical to the logic of the processor 910. In an embodiment, the processing core 912 includes, but is not limited to, pre-fetch logic to fetch instructions, decode logic to decode the instructions, execution logic to execute instructions and the like. In an embodiment, the processor 910 has a cache memory 916 to cache at least one of instructions and data for the bent-bridge device system 900. The cache memory 916 may be organized into a hierarchal structure including one or more levels of cache memory.

In an embodiment, the processor 910 includes a memory controller 914, which is operable to perform functions that enable the processor 910 to access and communicate with memory 930 that includes at least one of a volatile memory 932 and a non-volatile memory 934. In an embodiment, the processor 910 is coupled with memory 930 and chipset 920. The processor 910 may also be coupled to a wireless antenna 978 to communicate with any device configured to at least one of transmit and receive wireless signals. In an embodiment, the wireless antenna interface 978 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 932 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 934 includes, but is not limited to, flash memory, phase change memory (PCM), read-only memory (ROM), electrically erasable programmable read-only memory (EEPROM), or any other type of non-volatile memory device.

The memory 930 stores information and instructions to be executed by the processor 910. In an embodiment, the memory 930 may also store temporary variables or other intermediate information while the processor 910 is executing instructions. In the illustrated embodiment, the chipset 920 connects with processor 910 via Point-to-Point (PtP or P-P) interfaces 917 and 922. Either of these PtP embodiments may be achieved using a bent-bridge embodiment as set forth in this disclosure. The chipset 920 enables the processor 910 to connect to other elements in the bent-bridge device system 900. In an embodiment, interfaces 917 and 922 operate in accordance with a PtP communication protocol such as the Intel® QuickPath Interconnect (QPI) or the like. In other embodiments, a different interconnect may be used.

In an embodiment, the chipset 920 is operable to communicate with the processor 910, 905N, the display device 940, and other devices 972, 976, 974, 960, 962, 964, 966, 977, etc. The chipset 920 may also be coupled to a wireless antenna 978 to communicate with any device configured to at least do one of transmit and receive wireless signals.

The chipset 920 connects to the display device 940 via the interface 926. The display 940 may be, for example, a liquid crystal display (LCD), a plasma display, cathode ray tube (CRT) display, or any other form of visual display device. In and embodiment, the processor 910 and the chipset 920 are merged into a single bent-bridge device SOC. Additionally, the chipset 920 connects to one or more buses 950 and 955 that interconnect various elements 974, 960, 962, 964, and 966. Buses 950 and 955 may be interconnected together via a bus bridge 972 such as at least one bent-bridge structure. In an embodiment, the chipset 920 couples with a non-volatile memory 960, a mass storage device(s) 962, a keyboard/mouse 964, and a network interface 966 by way of at least one of the interface 924 and 974, the smart TV 976, and the consumer electronics 977, etc.

In and embodiment, the mass storage device 962 includes, but is not limited to, a solid state drive, a hard disk drive, a universal serial bus flash memory drive, or any other form of computer data storage medium. In one embodiment, network interface 966 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 9 are depicted as separate blocks within the bent-bridge device apparatus in a computing system 900, the functions performed by some of these blocks may be integrated within a single semiconductor circuit or may be implemented using two or more separate integrated circuits. For example, although cache memory 916 is depicted as a separate block within processor 910, cache memory 916 (or selected aspects of 916) can be incorporated into the processor core 912.

Where useful, the computing system 900 may have an outer shell such as a housing 132 depicted in FIG. 1F. In an embodiment, an outer shell is an electrically insulated structure that also provides physical protection for the bent-bridge device apparatus.

Figure 10:
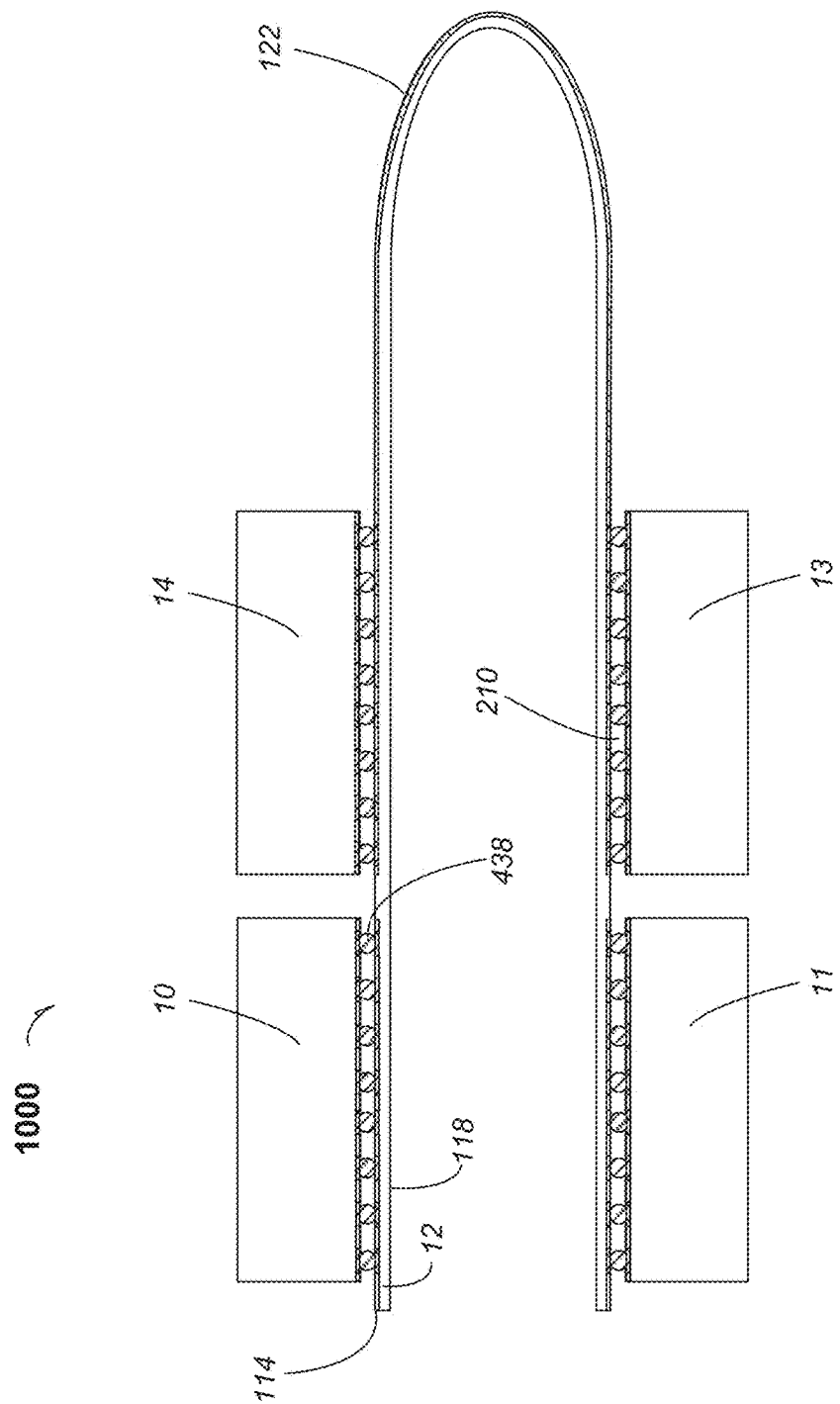
FIG. 10 is a cross-section elevation of a bent-bridge semiconductive apparatus according to an embodiment.

FIG. 10 is a cross-section elevation of a bent-bridge semiconductive apparatus 1000 according to an embodiment. A bent bridge 12 includes an active surface 114 and metallization 122. A backside surface 118 is opposite the active surface 114. In this embodiment, the bent bridge 12 not integral with a semiconductive device, rather, a first semiconductive device 10 is flip-chip mated to and in any event, electrically contacting the bent bridge 12 at the active surface 114 by at least one electrical bump, one of which is indicated with reference number 438.

In an embodiment, the bent bridge semiconductive apparatus 1000 includes the first semiconductive device 10 and a subsequent semiconductive device 11 also disposed on the active surface 114 of the bent bridge 12. In an embodiment, the bent bridge semiconductive apparatus 1000 includes the first semiconductive device 10, a second semiconductive device 14, and a subsequent semiconductive device 11, each also disposed on the active surface 114 of the bent bridge 12. In this embodiment, the second semiconductive device 14 is adjacent the first semiconductive device 10.

In an embodiment, the bent bridge semiconductive apparatus 1000 includes the first semiconductive device 10, a second semiconductive device 14, a third semiconductive device 13, and a subsequent semiconductive device 11, each also disposed on the active surface 114 of the bent bridge 12. In this embodiment, the third semiconductive device 13 is adjacent the subsequent semiconductive device 11.

It may now be understood that at least one of the several semiconductive devices may be integral with the bent bridge 12.

To illustrate the memory-die stacked memory module in a system in package apparatus embodiments and methods disclosed herein, a non-limiting list of examples is provided herein:

Example 1 is a bent-bridge semiconductive apparatus comprising: a first semiconductive device; and a silicon bridge that is integrally part of the first semiconductive device, wherein the silicon bridge is deflected out of planarity with respect to the first semiconductive device.

In Example 2, the subject matter of Example 1 optionally includes a subsequent semiconductive device that is integrally part of the first semiconductive device, and wherein the subsequent semiconductive device is spaced apart from the first semiconductive device by the silicon bridge.

In Example 3, the subject matter of any one or more of Examples 1-2 optionally include wherein the silicon bridge is a first silicon bridge, further including: a subsequent semiconductive device that is integrally part of the first semiconductive device, and wherein the subsequent semiconductive device is spaced apart from the first semiconductive device by the first silicon bridge; a second semiconductive device that is integrally part of the first semiconductive device; and a subsequent silicon bridge that is integrally part of the first semiconductive device, wherein the first and second semiconductive devices are spaced apart by the first silicon bridge, and wherein the second and subsequent semiconductive devices are spaced apart by the subsequent silicon bridge.

In Example 4, the subject matter of any one or more of Examples 1-3 optionally include wherein the silicon bridge is a first silicon bridge, further including: a subsequent semiconductive device that is integrally part of the first semiconductive device, and wherein the subsequent semiconductive device is spaced apart from the first semiconductive device by the first silicon bridge; a second semiconductive device that is integrally part of the first semiconductive device; a third silicon bridge that is integrally part of the first semiconductive device, wherein the second and third semiconductive devices are spaced apart by the third silicon bridge; a third semiconductive device that is integrally part of the first semiconductive device; and a subsequent silicon bridge that is integrally part of the first semiconductive device, wherein the third and subsequent semiconductive devices are spaced apart by the subsequent silicon bridge.

In Example 5, the subject matter of any one or more of Examples 1-4 optionally include a substrate coupled to the first semiconductive device at metallization by at least one of a pillar interconnect and an electrical bump.

In Example 6, the subject matter of any one or more of Examples 1-5 optionally include a substrate coupled to the first semiconductive device at metallization by at least one of a pillar interconnect and an electrical bump; a subsequent semiconductive device that is integrally part of the first semiconductive device, and wherein the subsequent semiconductive device is spaced apart from the first semiconductive device by the silicon bridge.

In Example 7, the subject matter of any one or more of Examples 1-6 optionally include a substrate coupled to the first semiconductive device at metallization by at least one of a pillar interconnect and an electrical bump; a subsequent semiconductive device that is integrally part of the first semiconductive device, and wherein the subsequent semiconductive device is spaced apart from the first semiconductive device by the silicon bridge, and wherein the subsequent semiconductive device is also coupled to the substrate device as metallization by at least one of a pillar and an electrical bump.

In Example 8, the subject matter of any one or more of Examples 1-7 optionally include the silicon bridge is deflected out of planarity in a range from 10 to 180°.

In Example 9, the subject matter of any one or more of Examples 1-8 optionally include wherein the silicon bridge is a first silicon bridge, further including; a second semiconductive device, wherein the first silicon bridge is integrally between the first semiconductive device and the second semiconductive device; a second silicon bridge; a third semiconductive device, wherein the second silicon bridge is integrally between the second semiconductive device and the third semiconductive device; a third silicon bridge; a fourth semiconductive device, wherein the third silicon bridge is integrally between the third semiconductive device and the fourth semiconductive device; a subsequent silicon bridge, wherein the subsequent silicon bridge is integrally between the fourth semiconductive device and the subsequent semiconductive device; and wherein the first, second, third, fourth and subsequent semiconductive devices are described along an arc.

In Example 10, the subject matter of Example 9 optionally includes a mandrel that describes the arc.

In Example 11, the subject matter of any one or more of Examples 9-10 optionally include wherein each semiconductive device includes an active surface, and wherein the arc creates a convex form factor at the active surfaces.

In Example 12, the subject matter of any one or more of Examples 9-11 optionally include wherein each semiconductive device includes an active surface, and wherein the arc creates a concave form factor at the active surfaces.

In Example 13, the subject matter of any one or more of Examples 1-12 optionally include an active device within the silicon bridge, wherein the active device is part of a logic region.

In Example 14, the subject matter of any one or more of Examples 1-13 optionally include a connected die that is coupled to the first semiconductive device by a bond wire.

In Example 15, the subject matter of any one or more of Examples 1-14 optionally include a connected die that is coupled to the first semiconductive device by an electrical bump.

In Example 16, the subject matter of any one or more of Examples 1-15 optionally include electrical connection selected from the group consisting of an electrical bump and an RDL coupled to the first semiconductive device at metallization on an active surface thereof.

In Example 17, the subject matter of any one or more of Examples 1-16 optionally include wherein the silicon bridge is deflected out of planarity to form at least a portion of a helix.

Example 18 is a method of assembling a bent-bridge semiconductive apparatus comprising: fabricating an integral first semiconductive device and a silicon bridge as a processed die; forming metallizations on the first semiconductive device and the silicon bridge; deflecting the silicon bridge out of planarity; and assembling the bent-bridge and first semiconductive device to a substrate.

In Example 19, the subject matter of Example 18 optionally includes fabricating a subsequent semiconductive device integral to the first semiconductive device and the silicon bridge, wherein the first and subsequent semiconductive devices are spaced apart by the silicon bridge.

In Example 20, the subject matter of Example 19 optionally includes folding the silicon bridge to about 180°.

In Example 21, the subject matter of any one or more of Examples 18-20 optionally include wherein the silicon bridge is a first silicon bridge further including: fabricating a subsequent semiconductive device integral to the first semiconductive device and first silicon bridge, wherein the first and subsequent semiconductive devices are spaced apart by the first silicon bridge; and fabricating a second semiconductive device integral to the first semiconductive device and the first silicon bridge; fabricating a subsequent semiconductive device integral to the first semiconductive device, wherein the second and subsequent semiconductive devices are spaced apart by the subsequent silicon bridge.

Example 22 is a computing system containing bent-bridge semiconductive apparatus, comprising: a first semiconductive device; a silicon bridge that is integrally part of the first semiconductive device, wherein the silicon bridge is deflected out of planarity with respect to the first semiconductive device; a subsequent semiconductive device that is integrally part of the first semiconductive device, and wherein the subsequent semiconductive device is spaced apart from the first semiconductive device by the silicon bridge, wherein the first and subsequent devices and the silicon bridge are affixed to a substrate; and a housing onto which the substrate is assembled.

In Example 23, the subject matter of Example 22 optionally includes wherein the housing is an outer shell.

Example 24 is a bent-bridge semiconductive apparatus comprising: a first semiconductive device; and a silicon bridge electrically contacting the first semiconductive device, wherein the silicon bridge is deflected out of planarity with respect to the first semiconductive device.

In Example 25, the subject matter of Example 24 optionally includes a subsequent semiconductive device that is electrically contacting silicon bridge, and wherein the subsequent semiconductive device is spaced apart from the first semiconductive device by the silicon bridge.

In Example 26, the subject matter of any one or more of Examples 24-25 optionally include a second semiconductive device that is electrically contacting the silicon bridge, wherein the second semiconductive device is adjacent the first semiconductive device; and a subsequent semiconductive device that is electrically contacting silicon bridge, and wherein the subsequent semiconductive device is spaced apart from the first semiconductive device by the silicon bridge where the silicon bridge is deflected out of planarity.

In Example 27, the subject matter of any one or more of Examples 24-26 optionally include a second semiconductive device that is electrically contacting the silicon bridge, wherein the second semiconductive device is adjacent the first semiconductive device; a subsequent semiconductive device that is electrically contacting silicon bridge, and wherein the subsequent semiconductive device is spaced apart from the first semiconductive device by the silicon bridge where the silicon bridge is deflected out of planarity; and a third semiconductive device that is electrically contacting the silicon bridge, wherein the third semiconductive device is adjacent the subsequent semiconductive device.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A bent-bridge semiconductive apparatus comprising:
   a first semiconductive device;
   a silicon bridge that is integrally part of the first semiconductive device, wherein the silicon bridge is deflected out of planarity with respect to the first semiconductive device, and
   electrical connection selected from the group consisting of an electrical bump and a redistribution layer coupled to the first semiconductive device at metallization on an active surface thereof.

2. The bent-bridge semiconductive apparatus of claim 1, further including a subsequent semiconductive device that is integrally part of the first semiconductive device, and wherein the subsequent semiconductive device is spaced apart from the first semiconductive device by the silicon bridge.

3. The bent-bridge semiconductive apparatus of claim 1, wherein the silicon bridge is a first silicon bridge, further including:
   a subsequent semiconductive device that is integrally part of the first semiconductive device, and wherein the subsequent semiconductive device is spaced apart from the first semiconductive device by the first silicon bridge;
   a second semiconductive device that is integrally part of the first semiconductive device; and
   a subsequent silicon bridge that is integrally part of the first semiconductive device, wherein the first and second semiconductive devices are spaced apart by the first silicon bridge, and wherein the second and subsequent semiconductive devices are spaced apart by the subsequent silicon bridge.

4. The bent bridge semiconductive apparatus of claim 1, wherein the silicon bridge is a first silicon bridge, further including:
   a subsequent semiconductive device that is integrally part of the first semiconductive device, and wherein the subsequent semiconductive device is spaced apart from the first semiconductive device by the first silicon bridge;
   a second semiconductive device that is integrally part of the first semiconductive device;
   a third silicon bridge that is integrally part of the first semiconductive device, wherein the second and third semiconductive devices are spaced apart by the third silicon bridge;
   a third semiconductive device that is integrally part of the first semiconductive device; and
   a subsequent silicon bridge that is integrally part of the first semiconductive device, wherein the third and subsequent semiconductive devices are spaced apart by the subsequent silicon bridge.

5. The bent-bridge semiconductive apparatus of claim 1, further including:
   a substrate coupled to the first semiconductive device at metallization by at least one of a pillar interconnect and an electrical bump.

6. The bent-bridge semiconductive apparatus of claim 1, further including:
   a substrate coupled to the first semiconductive device at metallization by at least one of a pillar interconnect and an electrical bump;
   a subsequent semiconductive device that is integrally part of the first semiconductive device, and wherein the subsequent semiconductive device is spaced apart from the first semiconductive device by the silicon bridge.

7. The bent-bridge semiconductive apparatus of claim 1, further including:
   a substrate coupled to the first semiconductive device at metallization by at least one of a pillar interconnect and an electrical bump;
   a subsequent semiconductive device that s integrally part of the first semiconductive device, and wherein the subsequent semiconductive device is spaced apart from the first semiconductive device by the silicon bridge, and wherein the subsequent semiconductive device is also coupled to the substrate device as metallization by at least one of a pillar and an electrical bump.

8. The bent-bridge semiconductive apparatus of claim 1, wherein the silicon bridge is deflected out of planarity in a range from 1° to 180°.

9. The bent-bridge semiconductive apparatus of claim 1, wherein the silicon bridge is a first silicon bridge, further including;
   a second semiconductive device, wherein the first silicon bridge is integrally between the first semiconductive device and the second semiconductive device;
   a second silicon bridge;
   a third semiconductive device, wherein the second silicon bridge is integrally between the second semiconductive device and the third semiconductive device;
   a third silicon bridge;
   a fourth semiconductive device, wherein the third silicon bridge is integrally between the third semiconductive device and the fourth semiconductive device;
   a subsequent silicon bridge, wherein the subsequent silicon bridge is integrally between the fourth semiconductive device and the subsequent semiconductive device; and
   wherein the first, second, third, fourth and subsequent semiconductive devices are described along an arc.

10. The bent-bridge semiconductive apparatus of claim 9, further including a mandrel that describes the arc.

11. The bent-bridge semiconductive apparatus of claim 9, wherein each semiconductive device includes an active surface, and wherein the arc creates a convex form factor at the active surfaces.

12. The bent-bridge semiconductive apparatus of claim 9, wherein each semiconductive device includes an active surface, and wherein the arc creates a concave form factor at the active surfaces.

13. The bent-bridge semiconductive apparatus of claim 1, further including an active device within the silicon bridge, wherein the active device is part of a logic region.

14. The bent-bridge semiconductive apparatus of claim 1, further including a connected die that is coupled to the first semiconductive device by a bond wire.

15. The bent-bridge semiconductive apparatus of claim 1, further including a connected die that is coupled to the first semiconductive device by an electrical bump.

16. The bent-bridge semiconductive apparatus of claim 1, wherein the silicon bridge is deflected out of planarity to form at least a portion of a helix.

17. A computing system containing bent-bridge semiconductive apparatus, comprising:
   a first semiconductive device;
   a silicon bridge that is integrally part of the first semiconductive device, wherein the silicon bridge is deflected out of planarity with respect to the first semiconductive device;

a subsequent semiconductive device that is integrally part of the first semiconductive device, and wherein the subsequent semiconductive device is spaced apart from the first semiconductive device by the silicon bridge, wherein the first and subsequent devices and the silicon bridge are affixed to a substrate;

a housing onto which the substrate is assembled, and electrical connection selected from the group consisting of an electrical bump and a redistribution layer coupled to the first semiconductive device at metallization on an active surface thereof.

18. The computing system of claim 17, wherein the housing is an outer shell.

19. A bent-bridge semiconductive apparatus comprising:
a first semiconductive device;
a silicon bridge electrically contacting the first semiconductive device, wherein the silicon bridge is deflected out of planarity with respect to the first semiconductive device, and
electrical connection selected from the group consisting of an electrical bump and a redistribution layer coupled to the first semiconductive device at metallization on an active surface thereof.

20. The bent-bridge semiconductive apparatus of claim 19, further including a subsequent semiconductive device that is electrically contacting silicon bridge, and wherein the subsequent semiconductive device is spaced apart from the first semiconductive device by the silicon bridge.

21. The bent-bridge semiconductive apparatus of claim 19, further including:

a second semiconductive device that is electrically contacting the silicon bridge, wherein the second semiconductive device is adjacent the first semiconductive device; and
a subsequent semiconductive device that is electrically contacting silicon bridge, and wherein the subsequent semiconductive device is spaced apart from the first semiconductive device by the silicon bridge where the silicon bridge is deflected out of planarity.

22. The bent-bridge semiconductive apparatus of claim 19, further including:
a second semiconductive device that is electrically contacting the silicon bridge, wherein the second semiconductive device is adjacent the first semiconductive device;
a subsequent semiconductive device that is electrically contacting silicon bridge, and wherein the subsequent semiconductive device is spaced apart from the first semiconductive device by the silicon bridge where the silicon bridge is deflected out of planarity;
a third semiconductive device that is electrically contacting the silicon bridge, wherein the third semiconductive device is adjacent the subsequent semiconductive device, and
electrical connection selected from the group consisting of an electrical hump and a redistribution layer coupled to the first semiconductive device at metallization on an active surface thereof.

* * * * *

UNITED STATES PATENT AND TRADEMARK OFFICE
CERTIFICATE OF CORRECTION

PATENT NO. : 10,141,265 B2  
APPLICATION NO. : 15/394388  
DATED : November 27, 2018  
INVENTOR(S) : Waidhas et al.

Page 1 of 1

It is certified that error appears in the above-identified patent and that said Letters Patent is hereby corrected as shown below:

In the Claims

In Column 15, Line 36, in Claim 4, delete "bent bridge" and insert --bent-bridge-- therefor In Column 16, Line 8, in Claim 7, delete "s" and insert --is-- therefor In Column 18, Line 26, in Claim 22, delete "hump" and insert --bump-- therefor Signed and Sealed this  
First Day of March, 2022

Drew Hirshfeld  
*Performing the Functions and Duties of the*  
*Under Secretary of Commerce for Intellectual Property and*  
*Director of the United States Patent and Trademark Office*